United States Patent [19]

Tanaka et al.

[11] Patent Number: 5,488,030
[45] Date of Patent: Jan. 30, 1996

[54] SUPERCONDUCTOR JUNCTION STRUCTURE INCLUDING TWO OXIDE SUPERCONDUCTOR LAYERS SEPARATED BY A NON-SUPERCONDUCTING LAYER

[75] Inventors: Saburo Tanaka; Takashi Matsuura; Hideo Itozaki, all of itami, Japan

[73] Assignee: Sumitomo Electric Industries, Inc., Japan

[21] Appl. No.: 366,408

[22] Filed: Dec. 29, 1994

Related U.S. Application Data

[63] Continuation of Ser. No. 126,753, Sep. 27, 1993, abandoned, which is a continuation of Ser. No. 759,548, Sep. 13, 1991, abandoned.

[30] Foreign Application Priority Data

Sep. 20, 1990 [JP] Japan .................................. 2-251620

[51] Int. Cl.$^6$ .......................... H01B 12/00; H01L 29/06; H01L 39/22
[52] U.S. Cl. ...................... 505/190; 505/237; 505/239; 257/33; 257/35
[58] Field of Search ........................ 357/5; 505/1, 700, 505/701, 702, 190–193, 234–239; 257/30–35, 39; 427/62, 63

[56] References Cited

U.S. PATENT DOCUMENTS 5,034,374  7/1991  Awaji et al. ................................. 357/5

FOREIGN PATENT DOCUMENTS 0017389  11/1980  European Pat. Off. .

(List continued on next page.)

OTHER PUBLICATIONS

K. Char et al, "Bi–Epitaxial Grain Boundary Junctions in $YBa_2Cu_3O_7$", Appl. Phys. Lett. 59 (6), Aug. 5, 1991, pp. 733–735.
R. B. laibowitz et al, "All High $T_c$ Edge Junctions and SQUIDS", Appl. Phys. Lett. 56 (7), Feb. 12, 1990, pp. 686–688.
Patent Abstracts of Japan, vol. 13, No. 103 (E–725) (3451). to Kato dated Mar. 10, 1989.
Patent Abstracts of Japan, vol. 13, No. 166 (E–746) (3514), to Kato dated Mar. 10, 1989.
Koch, R. H., "SQUIDs Made From High Temperature Superconductors," *Solid State Technology*, vol. 33, No. 5, May 1990, pp. 255–260.
IBM Technical Disclosure Bulletin, (Author unknown to Applicant) vol. 31, No. 9, Feb. 1989, pp. 217.
Arikawa et al., "Crystal Orientaion of $YBa_2Cu_3O_{7-y}$, Thin Films Prepared by RF Sputtering,"*Japanese Journal of Applied Physics*, vol. 29, No. 12 Dec., 1990, pp. L–2100–L–2202.

*Primary Examiner*—Mahshid Saadat
*Attorney, Agent, or Firm*—Beveridge, DeGrandi, Wellacher & Young

[57] ABSTRACT

There is disclosed a superconductor junction structure comprising: a first superconducting layer of an oxide superconductor formed in a desired pattern on a substrate; a non-superconducting layer of a non-superconductor formed on at least a part of the side faces of the first superconducting layer, a portion of the surface of the substrate near the part, and a top face of the first superconducting layer; and a second superconducting layer of the oxide superconductor formed on the non-superconducting layer, the non-superconducting layer being formed thin at the part, and forming a tunnel barrier. And further there is disclosed a process for fabricating a superconductor junction structure comprising: the first step of forming a first superconducting layer of an oxide superconductor in a desired pattern on a substrate; the second step of forming a non-superconducting layer of a non-superconductor formed on at least a part of the side faces of the first superconducting layer, a portion of the surface of the substrate near the part, and a top face of the first superconducting layer by depositing the non-superconductor from the above; and the third step of forming a second superconducting layer of the oxide superconductor on the non-superconducting layer.

12 Claims, 1 Drawing Sheet

FOREIGN PATENT DOCUMENTS

| | | | |
|---|---|---|---|
| 0458013 | 11/1991 | European Pat. Off. . | |
| 63-276284 | 11/1988 | Japan | 357/5 |
| 63-3306676 | 12/1988 | Japan | 357/5 |
| 139084 | 2/1989 | Japan | 257/33 |
| 135971 | 2/1989 | Japan | 257/33 |
| 135972 | 2/1989 | Japan | 357/5 |
| 1117376 | 5/1989 | Japan | 257/33 |
| 1-120878 | 5/1989 | Japan | 257/35 |

SUPERCONDUCTOR JUNCTION STRUCTURE INCLUDING TWO OXIDE SUPERCONDUCTOR LAYERS SEPARATED BY A NON-SUPERCONDUCTING LAYER

This application is a continuation of application Ser. No. 08/126,753, filed Sep. 27, 1993, which application is a continuaton of application Ser. No. 07/759,548, filed Sep. 13, 1991, both now abandoned which applications are entirely incorporated herein by reference.

DETAILED DESCRIPTION OF THE INVENTION

1. Field of the Invention

The present invention relates to a superconductor junction structure. Specifically the present invention relates to a new superconductor junction structure using an oxide superconductor.

2. Related Background Art

There are various structures for realizing superconductor junctions, which are represented by the Josephson junction, and the most preferable structure is the tunnel junction comprising a thin non-superconductor (which does not have superconductive characteristics) sandwiched by a pair of superconductors. Generally these superconductor junctions have very fine structures, and these superconductors and the non-superconductors are formed of the so-called films. For example, in realizing a tunnel junction by using an oxide superconducting material as the superconductors, a first oxide superconducting film, a non-superconducting film, and second oxide superconducting film are laminated in the stated order. The non-superconductor, an insulator, e.g., MgO or others, a semiconductor, e.g., Si or others, or a metal, e.g., Au or others, may be used as the non-superconductor, and they are selected, depending on the applications. Tunnel type superconductor junctions having such structures have different properties from one another depending on the selected material. On the other hand, a superconductor junction structure, which does not have a non-superconducting layer interposed in the barrier portion of a tunnel, is disclosed in Appl. Phys. Lett., 58(7), 12 Feb. 1990, p.686–688 published by R. B. Laibowitz et al. The oxide superconductor used in this superconductor junction structure disclosed therein is Y-B-C-O group.

The thickness of the non-superconductor of a tunnel type superconductor junction is determined by a coherence length of the superconductor. The oxide superconductors have very short coherence lengths, and therefore, the tunnel type superconductor junctions using oxide superconductors must have the non-superconductors of which the thickness is about some nano-meters.

On the other hand, in view of the operational properties of the superconductor junctions, the respective layers must be single crystals, or polycrystals having orientations very similar to single crystals.

In the above-described tunnel type superconductor junction, a first oxide superconducting film, a non-superconducting film and a second oxide superconducting film, each of which has good crystallinity, must be laminated.

It is difficult to form an oxide superconducting film having good crystallinity on an oxide superconducting film, and it is very difficult, to form an oxide superconducting film having good crystallinity further on the non-superconducting film, due to properties of the oxide superconductor. Conventionally, even if the above formed structure should have been realized, the desired good properties cannot be obtained due to unsatisfactory conditions of the interface between the oxide superconductor and the non-superconductor.

SUMMARY OF THE INVENTION

It is one object of the present invention to provide a superconductor junction structure and a process for producing the same which use an oxide superconductor and have a new constitution, and which can successfully solve the above-described conventional problems.

It is further object of the present invention to provide a superconductor junction structure comprising a first superconducting layer, a second superconducting layer, and a tunnel barrier of a non-superconducting layer formed between the first and the second superconducting layers and, characterized by the following features. That is, the superconductor junction structure according to this invention comprises a first superconducting layer of an oxide superconductor in a desired pattern on a substrate; a non-superconducting layer of a non-superconductor formed on at least a part of the side faces of the first superconducting layer, a portion of the surface of the substrate near said part, and a top face of the first superconducting layer; and a second superconducting layer of said oxide superconductor formed on the non-superconducting layer, the non-superconducting layer being formed thin at said part, and forming a tunnel barrier.

The process for fabricating the superconducting structure comprises the first step of forming a first superconducting layer of an oxide superconductor in a required pattern on a substrate; the second step of forming a non-superconducting layer of a non-superconductor on at least a part of the side faces of the first superconducting layer, a portion of the surface of the substrate near said part, and a top face of the first superconducting layer by depositing the non-superconductor from the above; and the third step of forming a second superconducting layer of said oxide superconductor on the non-superconducting layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1A:
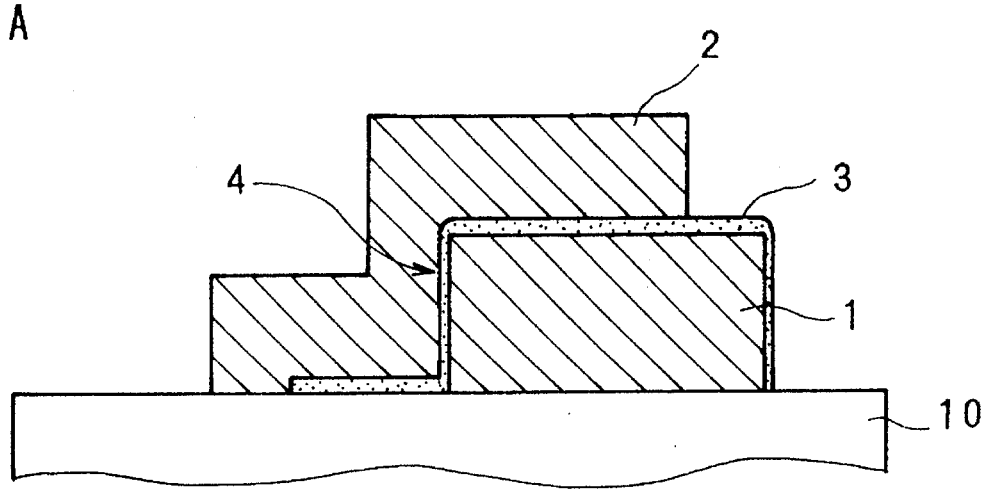
FIGS. 1A and 1B are views of the superconductor junction structure according to one embodiment of this invention, FIG. 1A being a sectional view of the plan view of FIG. 1B along the line A—A.

The superconductor junction structure according to the present invention has a first superconducting layer of an oxide superconductor, and a second superconducting layer of the oxide superconductor which is formed on the first superconducting layer in a T shape with respect to the first superconducting layer through a non-superconducting layer which is an insulator, and has one tunnel barrier between the first and second superconducting layers. In the superconductor junction structure, one superconductor junction is formed per one second superconducting layer For example, when two second superconducting layers are arranged parallel with each other, two superconductor junctions are formed.

The superconductor junction according to the present invention is a tunnel-type junction. In the present invention, the superconductor junction is not realized only by simple direct lamination of the superconducting layer, the non-superconducting layer and the superconducting layer among them. The superconductor junction is formed by the portions of the non-superconducting layer laminated on the first superconducting layer which are adjacent to the side faces of the first superconducting layer, and the portion of the second superconducting layer laminated on the non-superconducting layer which are juxtaposed with the side faces of the first superconducting layer. That is, the superconductor junction is formed in a direction parallel with the substrate.

To this end, in the superconductor junction structure according to the present invention, it is preferable to use a c-crystallographic axis oriented film of an oxide superconductor. This is the reason why the critical current density and the coherence length are high in a direction perpendicular to the c-crystallographic axis of the oxide superconductor. When the superconductor junction structure according to the present invention is formed of a c-crystallographic axis oriented oxide superconductor, its superconductor junction is formed in a direction perpendicular to the c-crystallographic axis, and has more superior properties.

The superconductor junction structure according to the invention, as described above, is not a structure in which the superconducting layer, non-superconducting layer and the superconducting layer are directly laminated on one another, and accordingly, it is not necessary to make the non-superconducting layer, which is to be sandwiched between the superconducting layers, ultra-thin. The non-superconducting layer may have an arbitrary thickness as long as the non-superconducting layer is not too thick at the portions thereof adjacent to the rising portion from an edge of the first superconducting layer, that is, the side face thereof, and the second superconducting layer laminated on the non-superconducting layer can be juxtaposed with the side faces of the first superconducting layer through the non-superconducting layer interposed therebetween. The non-superconducting layer may be formed by any optional process, such as spattering, vacuum evaporation, MBE, or laser beam abrasion, and especially preferably, the non-superconducting layer is formed by feeding material particles (molecules and gases) from a direction perpendicular to the surface of the substrate and depositing it on the surface of the substrate. This is the reason why the thus-fed material particles can be deposited thick on the face (i.e., the top face of the first superconducting layer) of the first superconducting layer which is parallel with the substrate and thin on the faces (i.e., the side faces of the first superconducting layer) of the first superconducting layer which is perpendicular to the substrate, to thereby form a unitary non-superconducting layer.

In the superconductor junction structure according to the present invention, the respective layers have parts grown from the surface of the substrate. Consequently, it is easy to epitaxially grow the non-superconducting layer on the first superconducting layer, and also the second superconducting layer on the non-superconducting layer. The layers of the resultant superconductor junction structure can have good crystallization.

In the superconductor junction structure according to the present invention, even if a plurality of the second superconducting layers are provided, these second superconducting layers are formed simultaneously so that all the superconductor junctions are formed simultaneously under the same conditions. Accordingly, it is possible that the resultant superconductor junctions can have all of the superconducting properties.

In the superconductor junction structure according to the invention, the substrate can be an oxide substrate, such as MgO, $SrTiO_3$ or others, and the superconducting layers can be an oxide superconductor, such as a Y-Ba-Cu-O group oxide superconductor, a Bi-Sr-Ca-Cu-O group oxide superconductor, a Tl-Ba-Ca-Cu-O group oxide superconductor or others. It is preferable to use an insulator, such as MgO or others, as the non-superconducting layer.

The present invention will be explained below in more detail referring to an embodiment. The following disclosure is merely an embodiment of the present invention and does not limit the scope of the present invention.

Figure 1B:
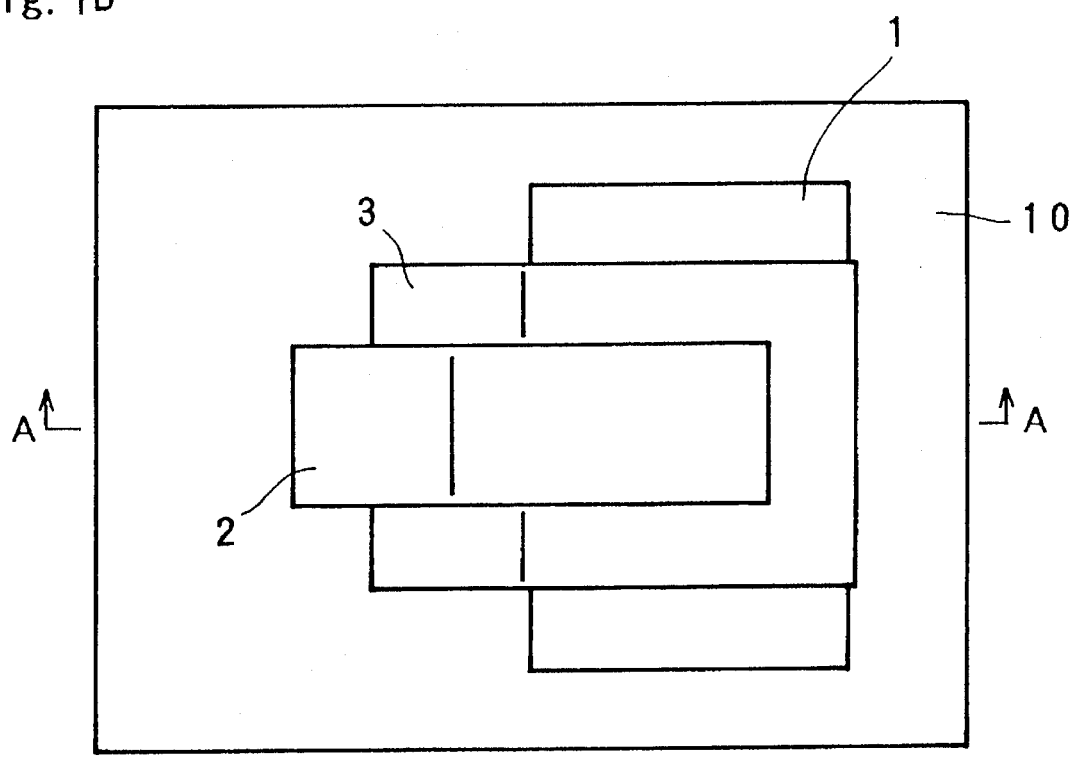

FIGS. 1A and 1B schematically show one example of the superconductor junction structure according to one embodiment of the present invention. FIG. 1A is a sectional view thereof, and FIG. 1B is a plan view thereof. The superconductor junction structure according to the present invention comprises a first superconducting layer 1 formed in a strip shape on a substrate, and a non-superconducting layer 3 formed thick at the portion thereof on the top surface of the first superconducting layer 1 and thin on the portions thereof on the edges, that is side faces, of the first superconducting layer, and a second superconducting layer 2 formed on the non-superconducting layer 3 to form a T shape with respect to the first superconducting layer 1. A tunnel type superconductor junction is formed at a portion 4 defined by the rising edges, that is the side faces, of the superconducting layer 1, the rising edges, that is side faces, of the non-superconducting layer 3, and the rising edges, that is the side faces, of the second superconducting layer 2. As shown in FIG. 1A, the non-superconducting layer 3 extends along the surface of the substrate 10 in a first direction. The thickness of the non-superconducting layer 3 on the side face of the first superconducting layer 1 is less than a length of the non-superconducting layer 3 extending in the first direction along the surface of the substrate 10. Also, as shown in FIG. 1A, the thickness of the non-superconducting layer 3 on the side face of the first superconducting layer 1 is thinner than the thickness of the non-superconducting layer 3 on the upper surface of the first superconducting layer 1.

In this superconductor junction structure, the first superconducting layer 1 has a thickness of, e.g., 300 nm, the non-superconducting layer 2 has a thickness of, e.g., 10 nm at the portion parallel with the substrate and, e.g., 5 nm at the portion vertical to the substrate, and the second superconducting layer 2 has a thickness of, e.g., 200 nm.

EXAMPLE 1

The superconductor junction structure of FIGS. 1A and 1B was fabricated using $Y_1Ba_2Cu_3O_{7-x}$ oxide superconductor as the oxide superconductor, and MgO as the non-superconductor. The substrate 10 was provided by a MgO (100).

Firstly, the first superconducting layer 1 was formed on the substrate 10 by spattering, using a mask of Si plate with an aperture, and a sintered body containing Y, Ba and Cu in an atomic ratio of 1:2:4.5 as the target. The aperture of the mask, that is; the plane shape of the first superconducting layer 1, had a dimension of 2 mm×50 μm, and the first superconducting layer has a thickness of 300 nm. The first superconducting layer 1 was grown on conditions which allowed the layer 1 to have the c-crystallographic axis. The spattering conditions were as follows.

| Substrate temperature Spattering gas | 630° C. |
|---|---|
| Ar | 8 SCCM |
| $O_2$ | 4 SCCM |
| Pressure | $5 \times 10^{-2}$ Torr |

Next, the non-superconducting layer 3 was formed on the thus-formed first superconducting layer 1 using a mask, and MgO as the target, by spattering.

The plane shape of the non-superconducting layer had a dimension of 1×5 μm and a thickness of 10 μm. The spattering conditions were as follows.

| Substrate temperature Spattering gas | 400° C. |
|---|---|
| Ar | 8 SCCM |
| $O_2$ | 4 SCCM |
| Pressure | $5 \times 10^{-2}$ Torr |

Finally, the second superconducting layer 2 was formed under the same conditions as the first superconducting layer 1. But the mask of Si plate was turned by 90°, and the spattering position was moved so that the second superconducting layer 2 was formed in a T shape with respect to the first superconducting layer 1. The second superconducting layer 2 had a thickness of 200 nm.

The thus-fabricated superconductor junction according to the present invention had the first and the second superconducting layers 1, 2 formed of c-crystallographic axis oriented $Y_1Ba_2Cu_3O_{7-x}$ superconductor, and the non-superconducting layer 3 formed of epitaxially grown MgO.

The fabricated superconductor junction according to the present invention was made into a device to measure its properties. The device was cooled down at 85K and was supplied with a 10 GHz frequency and an 0.1 mW-output microwave. Shapiro steps were observed at voltage points of multiples of 20.7 μV, and it was confirmed that a Josephson junction was realized.

EXAMPLE 2

The superconductor junction structure of FIG. 1 was fabricated using $Bi_2Sr_2Ca_2Cu_3O_x$ oxide superconductor as the oxide superconductor, and MgO as the non-superconductor. The substrate 10 was provided by a MgO (100).

Firstly, the first superconducting layer 1 was formed on the substrate 10 by spattering, using a mask of Si plate, and a sintered body containing Bi, Sr, Ca and Cu in an atomic ratio of 2:2:2:3 as the target. The plane shape of the first superconducting layer 1 had a dimension of 2 mm×50 μm, and a thickness of 300 nm. The first superconducting layer 1 was grown on conditions which allowed the layer 1 to have the c-crystallographic axis orientation. The spattering conditions were as follows.

| Substrate temperature Spattering gas | 650° C. |
|---|---|
| Ar | 8 SCCM |
| $O_2$ | 4 SCCM |
| Pressure | $5 \times 10^{-2}$ Torr |

Next, the non-superconducting layer 3 was formed on the thus-formed first superconducting layer 1 by spattering, using another mask, and MgO as the target.

The plane shape of the non superconducting layer 3 had a dimension of 1 mm×50 μm, and a thickness of 10 mm. The spattering conditions were as follows.

| Substrate temperature Spattering gas | 400° C. |
|---|---|
| Ar | 8 SCCM |
| $O_2$ | 4 SCCM |
| Pressure | $5 \times 10^{-2}$ Torr |

Finally, the second superconducting layer 2 was formed under the same conditions as the first superconducting layer 1. But the mask of Si plate was turned by 90°, and the spattering position was moved so that the second superconducting layer 2 is formed in a T shape with respect to the first superconducting layer 1. The second superconducting layer 2 had a thickness of 200 nm.

The thus-formed superconductor junction structure according to the present invention had the first and the second superconducting layers 1, 2 formed of c-crystallographic axis oriented $Bi_2Sr_2Ca_2Cu_3O_x$ superconductor, and the non-superconducting layer 3 formed of epitaxially grown MgO.

This superconductor junction prepared according to the present invention was made into a device to measure its properties. The device was cooled down at 85K and was supplied with a 10 GHz frequency and an 0.1 mW-output microwave. Shapiro steps were observed at voltage points of multiples of 41.3 μV, and it was confirmed that a Josephson junction was realized.

As described above, according to the present invention, an new tunnel type superconductor junction structure can be formed of an oxide superconductor. The superconductor junction structure according to the present invention can be easily formed without directly laminating the superconducting layers and the non-superconducting layer. Consequently, the resultant superconductor junction structure can have good properties.

The present invention accelerates the superconductor technology to electronic devices.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A superconductor junction structure, comprising:
   a first superconducting layer made of an oxide superconductor material formed in a desired pattern on a substrate;
   a unitary non-superconducting layer of a non-superconductor material formed on at least a part of a side face of said first superconducting layer and on an upper surface of said first superconducting layer, wherein a portion of a surface of the substrate is near said part, wherein a thickness of said non-superconducting layer on said part of said side face is thinner than a thickness of said non-superconducting layer on said upper surface, wherein the non-superconducting layer extends in a first direction along the surface of the substrate, and wherein the thickness of the non-superconducting layer on the side face is less than a length of the non-superconducting layer extending in the first direction along the surface of the substrate; and a second superconducting layer made of said oxide superconductor material of said first superconducting layer formed on at least a portion of said non-superconducting layer on said part of said side surface and said upper surface of said first superconducting layer, wherein a c-crystallographic axis of each of said first and second superconducting layers is perpendicular to the surface of the substrate, such that a superconductor junction is formed between said first superconducting layer and said second superconducting layer through said part in a direction parallel with said substrate.

2. A superconductor junction structure according to claim 1, wherein the first superconducting layer is formed in a strip-shape, and the second superconducting layer is formed in a strip-shape which forms a substantial T shape with respect to the first superconducting layer.

3. A superconductor junction structure according to claim 1, wherein the substrate is made of a metal oxide.

4. A superconductor junction structure according to claim 1, wherein the non-superconducting layer is made of a material selected from the group consisting of a metal, a semiconductor and an insulator.

5. A superconductor junction structure according to claim 1, wherein the first and the second superconducting layers are each formed of a material selected from the group consisting of a Cu-O group material, a Bi-Sr-Ca-Cu-O group material and a Tl-Ba-Ca-Cu-O group material.

6. A superconductor junction structure according to claim 1, wherein the first and the second superconducting layers are each formed of a material selected from the group consisting of a $Y_1Ba_2Cu_3O_{7-x}$ material and a $Bi_2Sr_2Ca_2Cu_3O_x$ material.

7. A superconductor junction structure, comprising:

a first superconducting layer made of an oxide superconductor material formed in a desired pattern on a substrate;

a non-superconducting layer of a non-superconductor material formed on at least a part of a side face of said first superconducting layer and on an upper surface of said first superconducting layer, wherein the non-superconducting layer extends in a first direction along a surface of the substrate, wherein a thickness of the non-superconducting layer on the side face is less than a length of the non-superconducting layer extending in the first direction along the surface of the substrate, and wherein the same non-superconductor material is formed on said substrate, on said part of said side face and on said upper surface of said first superconducting layer, and wherein the thickness of said non-superconducting layer on said part of said side face is thinner than a thickness of said non-superconducting layer on said upper surface; and a second superconducting layer made of said oxide superconductor material of said first superconducting layer formed on at least a portion of said non-superconducting layer on said part of said side surface and said upper surface of said first superconducting layer, wherein a c-crystallographic axis of each of said first and second superconducting layers is perpendicular to the surface of the substrate, such that a superconductor junction is formed between said first superconducting layer and said second superconducting layer through said part in a direction parallel with said substrate.

8. A superconductor junction structure according to claim 7, wherein the first superconducting layer is formed in a strip-shape, and the second superconducting layer is formed in a strip-shape which forms a substantial T-shape with respect to the first superconducting layer.

9. A superconductor junction structure according to claim 7, wherein the substrate is made of a metal oxide.

10. A superconductor junction structure according to claim 7, wherein the non-superconducting layer is made of a material selected from the group consisting of a metal, a semiconductor and an insulator.

11. A superconductor junction structure according to claim 7, wherein the first and the second superconducting layers are each formed of a material selected from the group consisting of a Cu-O group material, a Bi-Sr-Ca-Cu-O group material and a Tl-Ba-Ca-Cu-O group material.

12. A superconductor junction structure according to claim 7, wherein the first and the second superconducting layers are each formed of a material selected from the group consisting of a $Y_1Ba_2Cu_3O_{7-x}$ material and a $Bi_2Sr_2Ca_2Cu_3O_x$ material.

* * * * *